United States Patent
Lew et al.

(10) Patent No.: US 10,607,870 B2
(45) Date of Patent: Mar. 31, 2020

(54) SUBSTRATE CARRIER FOR ACTIVE/PASSIVE BONDING AND DE-BONDING OF A SUBSTRATE

(71) Applicant: APPLIED MATERIALS, INC., Santa Clara, CA (US)

(72) Inventors: Jen Sern Lew, Singapore (SG); Sriskantharajah Thirunavukarasu, Singapore (SG)

(73) Assignee: APPLIED MATERIALS, INC., Santa Clara, CA (US)

(*) Notice: Subject to any disclaimer, the term of this patent is extended or adjusted under 35 U.S.C. 154(b) by 205 days.

(21) Appl. No.: 15/291,762

(22) Filed: Oct. 12, 2016

(65) Prior Publication Data
US 2017/0103908 A1   Apr. 13, 2017

Related U.S. Application Data

(60) Provisional application No. 62/240,489, filed on Oct. 12, 2015.

(51) Int. Cl.
| | |
|---|---|
| B25B 11/00 | (2006.01) |
| H01L 21/673 | (2006.01) |
| H01L 21/67 | (2006.01) |
| H01L 21/687 | (2006.01) |
| H01L 21/683 | (2006.01) |

(52) U.S. Cl.
CPC .. *H01L 21/67346* (2013.01); *H01L 21/67092* (2013.01); *H01L 21/6831* (2013.01); *H01L 21/6838* (2013.01); *H01L 21/68757* (2013.01)

(58) Field of Classification Search
USPC .............. 269/20, 21, 24; 451/385, 400
See application file for complete search history.

(56) References Cited

U.S. PATENT DOCUMENTS

| | | | | |
|---|---|---|---|---|
| 5,980,367 A | * | 11/1999 | Metcalf | B24B 37/107 451/285 |
| 6,612,915 B1 | * | 9/2003 | Uzoh | B24B 37/30 205/206 |
| 7,480,129 B2 | * | 1/2009 | Brown | H01L 21/6831 361/234 |
| 2002/0050246 A1 | * | 5/2002 | Parkhe | H01L 21/67109 118/500 |
| 2002/0173248 A1 | * | 11/2002 | Doan | B24B 37/11 451/56 |

(Continued)

FOREIGN PATENT DOCUMENTS

| | | |
|---|---|---|
| JP | 2011-009692 A | 1/2011 |
| KR | 10-2012-0104841 A | 9/2012 |

*Primary Examiner* — Joseph J Hail
*Assistant Examiner* — Shantese L McDonald
(74) *Attorney, Agent, or Firm* — Moser Taboada; Alan Taboada

(57) ABSTRACT

Embodiments of substrate carriers which enable active/passive bonding and de-bonding of a substrate are provided herein. In some embodiments, a substrate carrier for holding a substrate comprises a disk formed of a porous material, the disk being formed symmetrically about a central axis and defining a substantially planar upper surface. In some embodiments, the porous material is silicon carbide and the substrate carrier includes a semi-porous surface coating formed atop the upper surface of the disk.

17 Claims, 3 Drawing Sheets

(56) References Cited

U.S. PATENT DOCUMENTS

| | | | |
|---|---|---|---|
| 2003/0121773 A1* | 7/2003 | Matsumura | H01L 21/67017 204/196.08 |
| 2004/0002291 A1* | 1/2004 | Renteln | B24B 21/04 451/41 |
| 2005/0128674 A1 | 6/2005 | Ohashi et al. | |
| 2005/0219786 A1* | 10/2005 | Brown | H01L 21/6831 361/234 |
| 2009/0061738 A1* | 3/2009 | Saka | C04B 41/009 451/38 |
| 2013/0316627 A1* | 11/2013 | Volovich | B24B 37/30 451/385 |
| 2014/0154868 A1* | 6/2014 | Sugo | H01L 21/6835 438/458 |
| 2015/0053337 A1 | 2/2015 | Fucetola et al. | |
| 2015/0214089 A1* | 7/2015 | Lee | H01L 21/6835 438/667 |
| 2016/0129547 A1* | 5/2016 | Duescher | B24B 37/042 438/693 |

* cited by examiner

US 10,607,870 B2

SUBSTRATE CARRIER FOR ACTIVE/PASSIVE BONDING AND DE-BONDING OF A SUBSTRATE

CROSS-REFERENCE TO RELATED APPLICATIONS

This application claims the benefit of U.S. Provisional Patent Application No. 62/240,489, filed on Oct. 12, 2015, which is herein incorporated by reference in its entirety.

FIELD

Embodiments of the present disclosure relate generally to the field of semiconductor manufacturing and, more particularly, to handling of substrates in a substrate processing procedure.

BACKGROUND

Substrate carriers support one or more substrates and are used to transport and hold the one or more substrates inside process chambers and/or other equipment. The carriers are frequently made of materials such as silicon carbide, silicon, or silicon carbide coated graphite, which allow them to be used at the elevated temperatures while the wafers are being processed. The inventors have identified a need for simple de-bonding of substrates that have gone through a process (e.g., a back-grinding process). Conventional bonding approaches using adhesive tapes on a rigid carrier may adhere to the substrate too strongly during de-bonding, resulting in mechanical stresses to the substrate.

Thus, the inventors have provided embodiments of improved substrate carriers that address one or more of the above disadvantages.

SUMMARY

Embodiments of substrate carriers which enable active/passive bonding and de-bonding of a substrate are provided herein. In some embodiments, a substrate carrier for holding a substrate includes a disk formed of a porous material, the disk being formed symmetrically about a central axis and defining a substantially planar upper surface.

In some embodiments, a substrate carrier for holding a substrate includes a disk having an exposed upper surface, an exposed lower surface, and a plurality of through holes extending from the upper surface to the lower surface to allow vacuum pressure from a vacuum chuck to be transmitted to a backside of a substrate on an upper surface of the disk to clamp the substrate to the disk.

In some embodiments, a bonding/de-bonding system for bonding or de-bonding a substrate to/from a substrate carrier includes a rigid base having a pocket formed in an upper surface for holding the substrate carrier; vacuum channels formed in the pocket; and a plurality of regions within the picket, each having a plurality of hole clusters.

Other and further aspects, features, and advantages of illustrative embodiments will be apparent from the following description given for the purpose of disclosure.

BRIEF DESCRIPTION OF THE DRAWINGS

Embodiments of the present disclosure, briefly summarized above and discussed in greater detail below, can be understood by reference to illustrative embodiments of the disclosure depicted in the appended drawings. However, the appended drawings illustrate only exemplary embodiments of the disclosure and are therefore not to be considered limiting of the scope of inventive principles disclosed, for such principles may admit to other equally effective embodiments.

Figure 1:
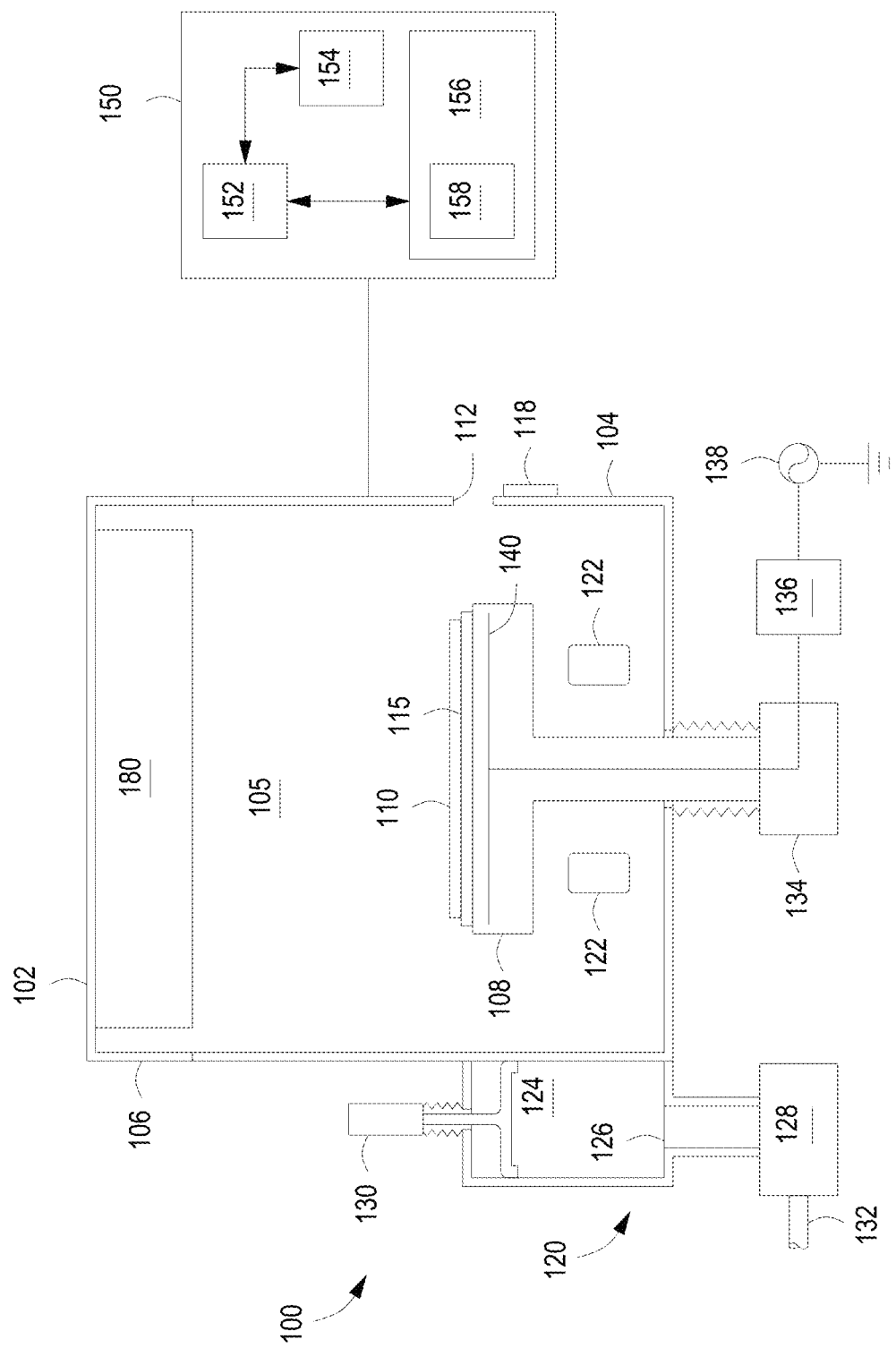
FIG. 1 depicts a process chamber suitable for use with a substrate carrier in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a system for a active bonding/de-bonding are disclosed herein. The inventive substrate carrier allows firm holding of a substrate during a process, such as, for example, back-grinding, and subsequently allow seamless transfer of the thinned substrate from the tool to another carrier platform while advantageously minimizing mechanical stresses exerted on the substrate during transfer, thus also minimizing potential damage to the substrate.

FIG. 1 depicts a system 100 suitable for processing a substrate in accordance with some embodiments of the present disclosure. In some embodiments, the system 100 is a substrate back-grinding system. However, the system 100 may alternatively be any processing system in which an improved holding of a substrate is desirable. The system 100 may comprise a controller 150 and a process chamber 102. Exemplary process chambers may include back-grinding chambers, available from Applied Materials, Inc. of Santa Clara, Calif. Other suitable process chambers may similarly be used.

The process chamber 102 has a chamber body 104 and a chamber lid 106 generally enclosing a processing volume 105. The processing volume 105 may be defined, for example, between a substrate support pedestal 108 disposed within the process chamber 102 and backgrinding equipment 180 disposed opposite the substrate support pedestal 108. The substrate support pedestal 108 is configured to support a substrate 110 placed on a removable substrate carrier 115 during substrate back-grinding operations. In some embodiments, the substrate support pedestal 108 may include a mechanism that retains or supports the substrate 110 and substrate carrier 115 on the surface of the substrate support pedestal 108, such as an electrostatic chuck, a vacuum chuck, a substrate retaining clamp, or the like (not shown).

For example, in some embodiments, the substrate support pedestal 108 may include a chucking electrode 140. The chucking electrode 140 may be coupled to one or more power sources (one power source 138 shown). Alternatively, the substrate support pedestal 108 may include a plurality of vacuum channels coupled to a vacuum source 136. The substrate 110 disposed on the substrate carrier 115 may enter the process chamber 102 via an opening 112 in a wall of the process chamber 102. The opening 112 may be selectively sealed via a slit valve 118, or other mechanism for selectively providing access to the interior of the chamber through the opening 112. The substrate support pedestal 108 may be coupled to a lift mechanism 134 that may control the position of the substrate support pedestal 108 between a lower position (as shown) suitable for transferring substrates into and out of the chamber via the opening 112 and a selectable upper position suitable for processing.

In some embodiments, the system 100 may include an exhaust system 120 for removing excess process gases, processing by-products, or the like, from the interior of the process chamber 102. The exhaust system 120 generally includes a pumping plenum 124 and one or more conduits that couple the pumping plenum 124 to the inner volume (and generally, the processing volume 105) of the process chamber 102, for example via one or more inlets 122 (two inlets shown). A vacuum pump 128 may be coupled to the pumping plenum 124 via a pumping port 126 for pumping out the exhaust gases from the process chamber 102. The vacuum pump 128 may be fluidly coupled to an exhaust outlet 132 for routing the exhaust as needed to appropriate exhaust handling equipment. A valve 130 (such as a gate valve, or the like) may be disposed in the pumping plenum 124 to facilitate control of the flow rate of the exhaust gases in combination with the operation of the vacuum pump 128. Although a z-motion gate valve is shown, any suitable, process compatible valve for controlling the flow of the exhaust may be utilized.

To facilitate control of the process chamber 102 as described above, the system may include a controller 150, which may be one of any form of general-purpose computer processor that can be used in an industrial setting for controlling various chambers and sub-processors. The memory, or computer-readable medium, 156 of the CPU 152 may be one or more of readily available memory such as random access memory (RAM), read only memory (ROM), floppy disk, hard disk, or any other form of digital storage, local or remote. The support circuits 154 are coupled to the CPU 152 for supporting the processor in a conventional manner. These circuits include cache, power supplies, clock circuits, input/output circuitry and subsystems, and the like.

Processes may generally be stored in the memory 156 as a software routine 158 that, when executed by the CPU 152, causes the process chamber 102 to perform processes of the present disclosure. The software routine 158 may also be stored and/or executed by a second CPU (not shown) that is remotely located from the hardware being controlled by the CPU 152. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine 158 may be executed after the substrate 110 is positioned on the substrate support pedestal 108. The software routine 158, when executed by the CPU 152, transforms the general purpose computer into a specific purpose computer (controller) 150 that controls the chamber operation such that the processes are performed.

Figure 2:
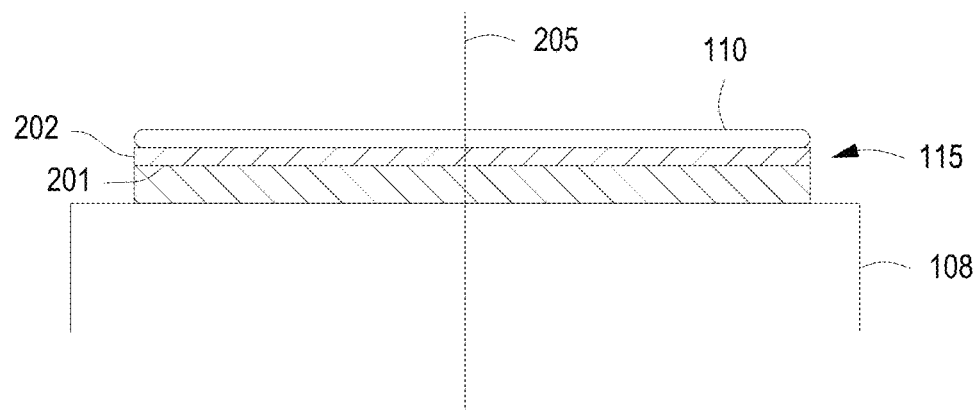
FIG. 2 a schematic side view of a substrate carrier disposed atop a substrate support pedestal in accordance with some embodiments of the present disclosure.

FIG. 2 depicts a schematic side view of the substrate 110 and the substrate carrier 115 disposed on the substrate support pedestal 108. In some embodiments, the substrate carrier 115 may be a disk formed of a porous material, the disk being formed symmetrically about a central axis 205 and defining a substantially planar upper surface 201. The substrate carrier 115 includes a first side including the substantially planar upper surface 201 and an opposing second side. In some embodiments, the second side of the substrate carrier 115 is a substantially planar exposed surface, such that the substrate carrier 115 may be placed on and removed from the substrate support pedestal 108. The substrate carrier 115 is formed of a porous material having a porosity sufficient to transmit a negative vacuum pressure from a vacuum chuck (e.g., the substrate support pedestal 108) to a backside of the substrate 110 to clamp the substrate 110 onto the substrate carrier 115. Exemplary materials with a sufficient porosity to transmit the vacuum pressure to the substrate 110 may include silicon carbide. However, similar materials may alternatively be used. In some embodiments, the carrier may be formed of, for example, aluminum nitride having a purity between about 90 and 100%, a density between about 3.0 kg/m$^3$ and 4 kg/m$^3$, and a porosity of less than 1. In some embodiments, the aluminum nitride carrier may have a purity of about 97% and a density of about 3.3 kg/m$^3$. In some embodiments, the substrate carrier 115 has a thickness that is about 1.25 to about 1.5 times the thickness of the substrate 110. For example, the substrate carrier 115 may have a thickness of about 0.7 mm to about 2 mm.

In some embodiments, a semi-porous surface coating 202 may be applied (e.g., spray coated) to the upper surface 201 of the substrate carrier 115 to provide moderate adhesion so that the substrate 110 does not move around during transfer of the substrate carrier 115 and the substrate 110. The surface coating 202 provides a "tacky" surface that prevents the substrate 110 from easily moving around. Although the surface coating 202 is depicted as covering the entire upper surface 201, the surface coating 202 may alternatively be limited to a periphery of the upper surface 201. The surface coating 202 is formed of a semi-porous material that allows the vacuum pressure to be transmitted to a backside of the substrate 110 for clamping the substrate to the substrate carrier 115. Suitable materials include, for example, polydimethylsiloxane (PDMS). However, similar materials may alternatively be used to achieve the same purpose.

During a back-grinding process, the substrate carrier 115 with the substrate 110 disposed atop is supported by the substrate support pedestal 108. The carrier allows transmission of a vacuum pressure exerted by the vacuum chuck (i.e., the substrate support pedestal 108) to create a clamping pressure greater than about 70 kPa on the substrate 110. After the process is completed, a transfer apparatus extends through the opening 112 to transfer the substrate carrier 115 and the substrate 110 to another location (e.g., another chamber).

For general handling (i.e., moving of the substrate carrier 115 and substrate 110 between chambers), the substrate 110 may be passively adhered to the substrate carrier 115 via the surface coating 202, which acts as a non-sticky adhesive. In some embodiments, an edge step may be formed at the perimeter of the substrate carrier 115 so that the surface coating 202 remains almost flush with the upper surface 201. To ensure that the substrate 110 is sufficiently held in place by the surface coating 202, the substrate carrier 115 may be placed onto a vacuum chuck, the substrate 110 placed atop the substrate carrier 115, a vacuum applied to the substrate 110 clamping the substrate 110 to the carrier, and the vacuum released. During clamping, the surface coating 202 is compressed, thus forming a contact grip between the surface coating 202 and the backside of the substrate 110. As a result, the substrate 110 is passively bonded to the carrier via a mechanical grip sufficient for general handling/transfer of the substrate 110 (i.e., sufficient to prevent movement of the substrate during handling/transfer of the substrate 110).

Figure 3:
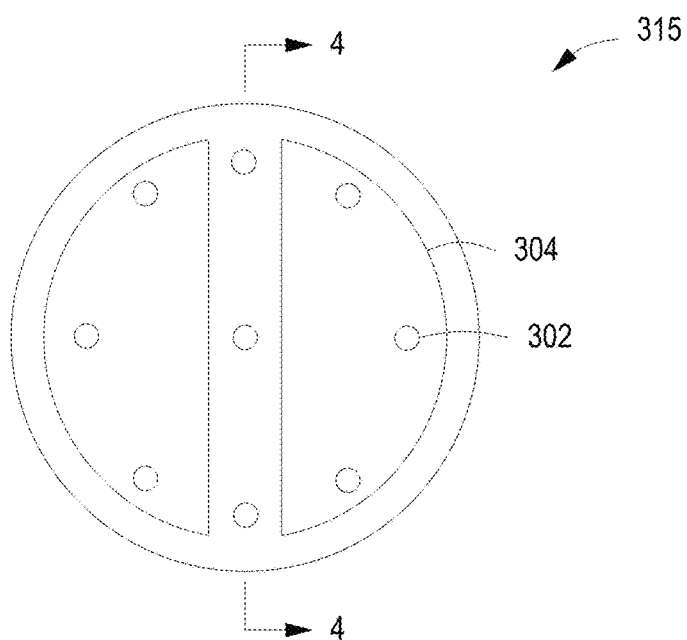
FIG. 3 depicts a top plan view of a substrate carrier in accordance with some embodiments of the present disclosure.
Figure 4:
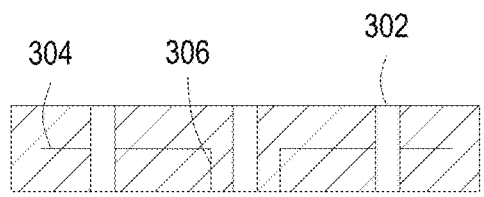
FIG. 4 depicts a cross sectional view of the substrate carrier of FIG. 3, taken across the reference plane 4-4'.

FIG. 3 depicts a top view a substrate carrier 315 in accordance with some embodiments of the present disclosure. FIG. 4 depicts a cross-sectional view of the substrate carrier 315 taken along reference plane 4-4'. The substrate carrier 315 is a disk having an exposed upper surface, an exposed lower surface, and a plurality of through holes 302 extending from the upper surface to the lower surface to allow vacuum pressure from a vacuum chuck to be transmitted to a backside of a substrate on an upper surface of the disk to clamp the substrate to the disk. When the substrate carrier 315 is placed atop a vacuum chuck, the through holes 302 allow a negative vacuum pressure to be transmitted to a backside of the substrate, thus clamping the substrate onto the substrate carrier 315. In some embodiments (and as shown in FIG. 3), the plurality of through holes 302 may be arranged in a circle at or near the peripheral location of the substrate 110 and at the center of the substrate carrier 315. However, the plurality of through holes 302 may be arranged in other configurations to facilitate clamping of the substrate 110 to the substrate carrier 315. In some embodiments, each of the through holes 302 has a diameter of about 1 mm. In some embodiments, the substrate carrier 315 may optionally include one or more electrodes 304, which provide an electrostatic clamping force to the substrate when coupled to an electrostatic chuck via leads 306 that electrically couple the one or more electrodes 304 to the electrostatic chuck. As such, the substrate carrier 315 may advantageously be used with both vacuum chucks and electrostatic chucks.

Figure 5:
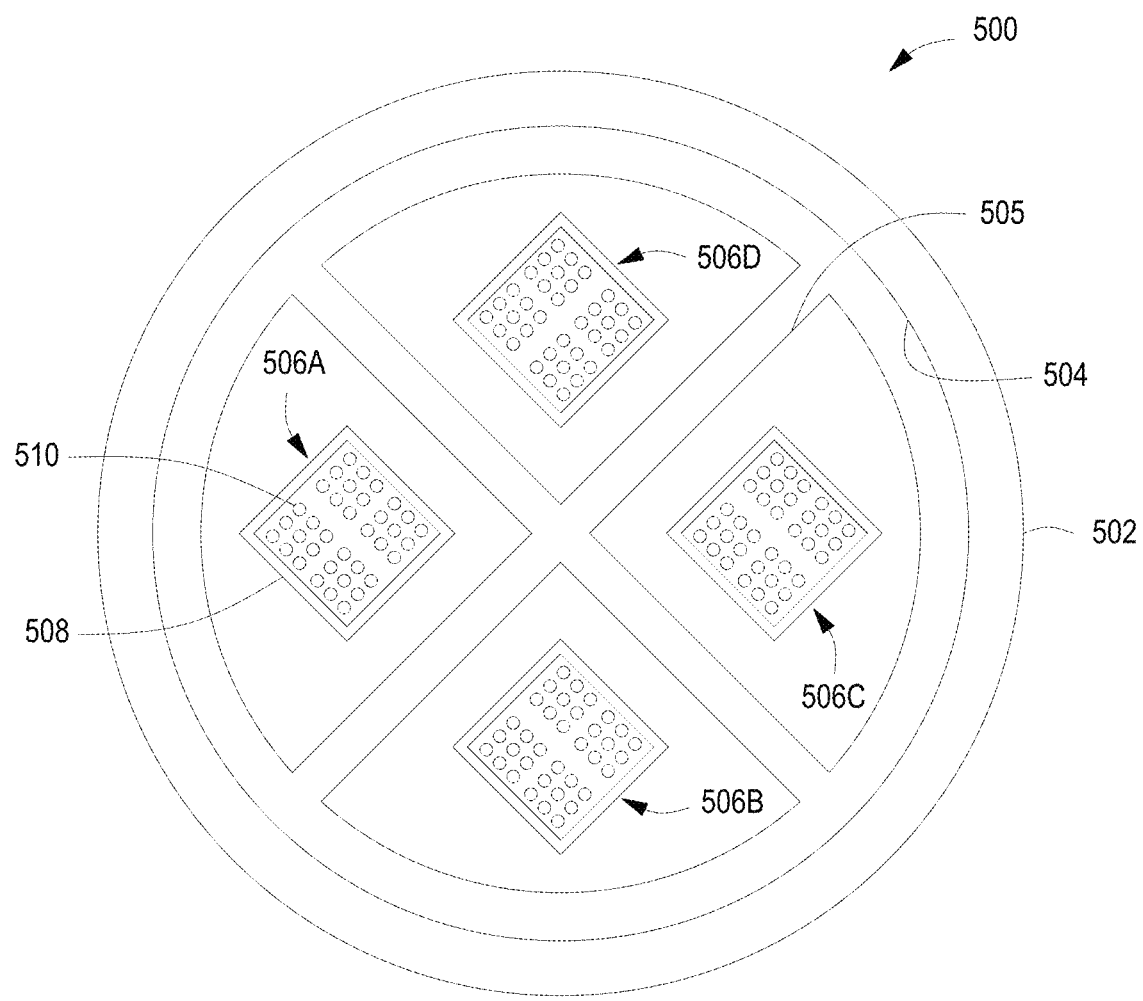
FIG. 5 depicts a top plan view of bonding/de-bonding system in accordance with some embodiments of the present disclosure.

FIG. 5 depicts a bonding/de-bonding system 500 for bonding or de-bonding a substrate to/from a substrate carrier in accordance with some embodiments of the present disclosure. The bonding/de-bonding system 500 includes a rigid base 502 with a pocket 504 for holding the substrate carrier 115. A pneumatic manifold (not shown) within the base allows control of either negative pressure, positive pressure, or both simultaneously at different regions of the substrate carrier 115.

During de-bonding, a passively bonded substrate is brought onto the rigid base. A negative vacuum pressure is applied via channels 505 of the rigid base 502 to hold the substrate carrier 115 down. A positive pressure is applied at select regions $506_A$, $506_B$, $506_C$, and/or $506_D$ to eject gas into the interface between the substrate and the substrate carrier 115. In the embodiment depicted in FIG. 5, the bonding/de-bonding system 500 includes four regions $506_A$, $506_B$, $506_C$, and $506_D$. However, any number of regions may alternatively be used to facilitate bonding and de-bonding of the substrate as explained above. Each of the regions includes a plurality of hole clusters 510 sealed off from the surrounding environment via a sealing ring 508. In some embodiments, each hole of the hole clusters 510 may have a diameter of about 0.2 mm to about 0.4 mm. In some embodiments, each cluster within each sealing ring 508 is separated from an adjacent cluster by between about 2 mm to about 3 mm. In some embodiments, each cluster within each sealing ring 508 is separated from an adjacent cluster by about 2.5 mm. The overall negative pressure transmitted to the carrier is greater than the positive pressure exerted on the carrier to ensure that the carrier remains in the pocket 504 while the substrate is de-bonded. Because the passive bonding between the surface coating 202 and the substrate 110 is not strong, the pressure reversal de-bonds the substrate 110 with minimal stress.

Alternatively, a bonded substrate may be secured in the rigid base by means of negative pressure. Subsequently, a vacuum/electrostatic wand transfer arm is brought to a top surface of the substrate. Either vacuum or electrostatic bonding is initiated between the substrate and the transfer arm, resulting in clamping on both sides of the substrate 110 and substrate carrier 115 stack (i.e., negative pressure on the carrier side and negative pressure/electrostatic force on the substrate side). Finally, a positive pressure gas purge is ejected through the rigid base and the substrate carrier 115 at select regions to de-bond the substrate 110 from the substrate carrier 115. As a result, the substrate 110 may advantageously be easily separated from the substrate carrier 115 with minimal mechanical stress.

While the foregoing is directed to embodiments of the present disclosure, other and further embodiments of the disclosure may be devised without departing from the basic scope of the present disclosure.

The invention claimed is:

1. A substrate carrier for holding a substrate, comprising:
a disk formed of a porous material, the disk being formed symmetrically about a central axis and defining a substantially planar upper surface and an exposed opposing lower surface, wherein the porous material extends from the substantially planar upper surface to the exposed opposing lower surface;
a semi-porous surface coating formed on the substantially upper surface; and
wherein the semi-porous surface coating is formed solely on a periphery of the substantially planar upper surface.

2. The substrate carrier of claim 1, wherein the disk includes an edge step formed in the periphery of the substantially planar upper surface, and wherein the semi-porous surface coating is disposed on the edge step so that the semi-porous surface coating is substantially flush with the substantially planar upper surface.

3. The substrate carrier of claim 1, wherein the semi-porous surface coating comprises polydimethylsiloxane.

4. The substrate carrier of claim 1, wherein the substrate carrier has a thickness of between about 0.7 mm to about 2 mm.

5. The substrate carrier of claim 1, wherein the porous material comprises silicon carbide.

6. The substrate carrier of claim 1, further comprising a plurality of through holes extending from the substantially planar upper surface to the exposed opposing lower surface.

7. A substrate carrier for holding a substrate, comprising:
a disk having an exposed upper surface, an exposed lower surface, and a plurality of through holes extending from the upper surface to the lower surface to allow vacuum pressure from a vacuum chuck to be transmitted to a backside of a substrate on an upper surface of the disk to clamp the substrate to the disk; and
one or more electrodes disposed within the disk and configured to couple to leads of an electrostatic chuck to electrostatically clamp the substrate onto the upper surface of the disk.

8. The substrate carrier of claim 7, wherein the plurality of through holes are arranged in a circle at or near a position corresponding to a periphery of the substrate and at a center of the disk.

9. The substrate carrier of claim 7, wherein each of the plurality of through holes has a diameter of about 1 mm.

10. A bonding/de-bonding system for bonding or de-bonding a substrate to/from a substrate carrier, comprising:

a rigid base having a pocket formed in an upper surface for holding the substrate carrier;

vacuum channels formed in the pocket, wherein the vacuum channels are configured to transmit a first pressure at an interface of the substrate and the substrate carrier; and a plurality of regions within the pocket, each region of the plurality of regions having a plurality of hole clusters, wherein the plurality of hole clusters are configured to transmit a second pressure different than the first pressure at the interface of the substrate and the substrate carrier.

11. The bonding/de-bonding system of claim 10, wherein each of the plurality of hole clusters is sealed off from a surrounding environment via a sealing ring.

12. The bonding/de-bonding system of claim 10, wherein the vacuum channels include an outer ring, and the plurality of hole clusters are disposed radially inward of the outer ring.

13. The bonding/de-bonding system of claim 10, wherein each cluster within each sealing ring is separated from an adjacent cluster by between about 2 mm and about 3 mm.

14. The bonding/de-bonding system of claim 10, wherein the plurality of regions includes four regions.

15. The bonding/de-bonding system of claim 10, wherein the vacuum channels are configured to transmit a negative pressure to the substrate carrier and the plurality of regions are configured to transmit a positive pressure at the interface of the substrate and the substrate carrier.

16. The bonding/de-bonding system of claim 15, wherein the positive pressure is achieved by ejecting a gas into the interface.

17. The bonding/de-bonding system of claim 15, wherein the negative pressure is greater than the positive pressure to ensure the substrate carrier remains in the pocket while the substrate is removed from the substrate carrier.

* * * * *